United States Patent
Heremans et al.

(10) Patent No.: US 6,630,882 B1
(45) Date of Patent: Oct. 7, 2003

(54) COMPOSITE MAGNETIC SENSOR

(75) Inventors: Joseph Pierre Heremans, Troy, MI (US); Dale Lee Partin, Ray Township, MI (US); Thaddeus Schroeder, Rochester Hills, MI (US)

(73) Assignee: Delphi Technologies, Inc., Troy, MI (US)

( * ) Notice: Subject to any disclaimer, the term of this patent is extended or adjusted under 35 U.S.C. 154(b) by 256 days.

(21) Appl. No.: 09/621,065

(22) Filed: Jul. 21, 2000

Related U.S. Application Data

(60) Provisional application No. 60/147,424, filed on Aug. 5, 1999.

(51) Int. Cl.[7] .......................... H01L 43/00; H01L 43/02; H01L 43/04; H01L 43/06; H01L 43/08; H01L 29/82; H01L 29/00; H01L 21/00

(52) U.S. Cl. .................. 338/32 H; 338/32 R; 257/425; 257/536; 438/48

(58) Field of Search .................................. 257/425, 536; 438/48; 324/207.21, 251, 252; 338/32 H, 32 R

(56) References Cited

U.S. PATENT DOCUMENTS

| | | | |
|---|---|---|---|
| 3,617,975 A | 11/1971 | Wieder | 338/32 |
| 4,835,467 A | 5/1989 | Gokhale | 324/166 |
| 4,926,122 A | 5/1990 | Schroeder et al. | 324/207.13 |
| 4,939,456 A | 7/1990 | Morelli et al. | 324/207.21 |
| 5,184,106 A | 2/1993 | Partin et al. | 338/32 R |
| 5,314,547 A * | 5/1994 | Heremans et al. | 148/33.1 |
| 5,385,864 A * | 1/1995 | Kawasaki et al. | 117/89 |
| 5,404,102 A | 4/1995 | Gokhale et al. | 324/252 |
| 5,605,860 A * | 2/1997 | Kawasaki et al. | 117/105 |
| 5,883,564 A * | 3/1999 | Partin | 338/32 H |

OTHER PUBLICATIONS

H.H. Wieder, "Anomalous Transverse Magnetoresistance of InSb Films," Journal of Applied Physics, vol. 40, No. 8, Jul. 1969, pp. 3320–3325.

* cited by examiner

Primary Examiner—Steven Loke
Assistant Examiner—Samuel A Gebremariam
(74) Attorney, Agent, or Firm—Margaret A. Dobrowitsky

(57) ABSTRACT

Composite galvanomagnetic devices having a desired combination of properties in specific temperature ranges and magnetic field ranges and so combined that desired properties are provided over an extended temperature and magnetic field range. In practice this can be accomplished with a single die with layers of different properties. Particularly, the present invention addresses this method as related to magnetoresitors and Hall plates.

11 Claims, 5 Drawing Sheets

US 6,630,882 B1

COMPOSITE MAGNETIC SENSOR

CROSS-REFERENCE TO RELATED APPLICATIONS

The present application is a continuation-in-part application of provisional application Ser. No. 60/147,424, filed on Aug. 5, 1999.

TECHNICAL FIELD

The present invention relates to galvanomagnetic devices.

BACKGROUND OF THE INVENTION

The magnetic sensitivity of virtually all galvanomagnetic sensors such as Hall generators, magnetoresistors (MRs), etc. are temperature dependent. It is well known in the art that the resistance modulation of galvanomagnetic sensors can be employed in position and speed sensors with respect to moving ferromagnetic materials or objects (see for example U.S. Pat. Nos. 4,835,467, 4,926,122, and 4,939,456).

The shortcoming of galvanomagnetic sensors is their temperature sensitivity. They have a negative temperature coefficient of resistance and their resistance can drop as much as 50% when heated to 180 degrees Celsius (180° C.). Generally, this led to the use of MR devices in matched pairs for temperature compensation. Additionally, it is preferable to drive MR devices with current sources since, with the same available power supply, the output signal is nearly doubled in comparison with a constant voltage source.

To compensate for the MR resistance drop at higher temperatures, and thus, the magnitude decrease of the output signal resulting in decreased sensitivity of the MR device, it is also desirable to make the current of the current source automatically increase with the MR temperature increase. This is shown in U.S. Pat. No. 5,404,102 in which an active feedback circuit automatically adjusts the current of the current source in response to temperature variations of the MR device.

The temperature dependence of galvanomagnetic sensors makes it very difficult, if not even impossible, to design devices having the desired properties over extended temperature ranges such as some of the present automotive ones from −40° C. to nearly 200° C. Currently employed techniques of doping decrease the magnetic sensitivity along with the sought after decrease in temperature sensitivity. In the limit, using the present doping approach one might obtain devices insensitive to temperature, but also practically insensitive to magnetic fields.

It should be noted that the present invention differs from U.S. Pat. No. 5,184,106 to Partin and Heremans in that U.S. Pat. No. 5,184,106 gave a recipe for maximum electron mobility, whereas the present invention trades off the magnitude of the mobility for increased temperature stability.

What is needed is a method to compensate for the temperature dependence of galvanomagnetic sensors.

SUMMARY OF THE INVENTION

We discovered that for wide temperature ranges one can tailor the properties of galvanomagnetic devices by controlling doping types and levels, film thickness, alloy composition, device geometry, etc. The present invention involves, generally, the making of galvanomagnetic device layers with a desired combination of properties in specific temperature ranges and magnetic field ranges and combining them into a single composite galvanomagnetic device having the desired properties in an extended temperature and magnetic field range. The process of combining would result in a single die with layers of different properties.

More specifically, the present invention addresses magnetoresistors and Hall effect devices, also known in the art as Hall effect plates or Hall plates. Further, the present invention describes a recipe to manufacture magnetoresistors and Hall effect devices utilizing semiconductors such as indium antimonide (InSb) with a magnetic field sensitivity that is independent of temperature.

It is known that indium-antimonide magnetoresistors and Hall effect devices made out of material doped with rare earth elements, such as erbium or samarium have less temperature dependence to their magnetic sensitivity. Advantages of the present invention thereover include:

1. indium-antimonide magnetic field sensors have a larger temperature range than silicon-based Hall sensors, which are essentially limited to temperatures slightly above 150 degrees centigrade; and
2. the present recipe is easier to manufacture than the rare earth doped indium antimonide magnetic field sensors, because it uses only chemicals that are conventional in the fabrication of eptitaxial compound semiconductors.

Accordingly, it is an object of the present invention to reduce the temperature sensitivity of galvanomagnetic devices using the above recounted solutions.

DETAILED DESCRIPTION OF THE PREFERRED EMBODIMENT

Virtually all galvanomagnetic sensors such as Hall generators, magnetoresistors, etc. are temperature dependent in a way that affects their magnetic sensitivity, defined as $$S(B)=(1/V_{out})\times(dV_{out}/dB).$$

This makes it very difficult, if not even impossible, to design devices having the desired properties over extended temperature ranges such as some of the present automotive ones from −40° C. to nearly 200° C. Currently employed techniques of doping decrease the magnetic sensitivity along with the sought after decrease in temperature sensitivity. In the limit, using the current doping approach one might obtain devices insensitive to temperature, but also practically insensitive to magnetic fields.

The main parameter influencing the sensitivity of a galvanomagnetic device is the mobility of the semiconductor. We start by observing that the mobility of the holes in, for example, InSb is much smaller than that of electrons. Also, since the energy gap is small at a certain temperature near room temperature, thermally induced electrons start to appear as the sample temperature is increased, even in p type doped material. In p type doped material, current is mainly transported by the holes at low temperature, where there are only holes. As soon as a temperature is reached where a few electrons appear, they will carry more current because their mobility is much larger. The temperature dependence of the overall mobility, as averaged over both electrons and holes, of p type doped InSb has therefore a maximum at the temperature near which the semiconductor "goes intrinsic", i.e. transport of current is transferred from holes (at low temperature) to electrons (at high temperature), this is defined as the "peak mobility". It must be pointed out that these peaks in mobility can occur at a temperature outside the range used; for example, trace 34 (see FIG. 1) will peak at a temperature in excess of about 475 K.

Figure 1:
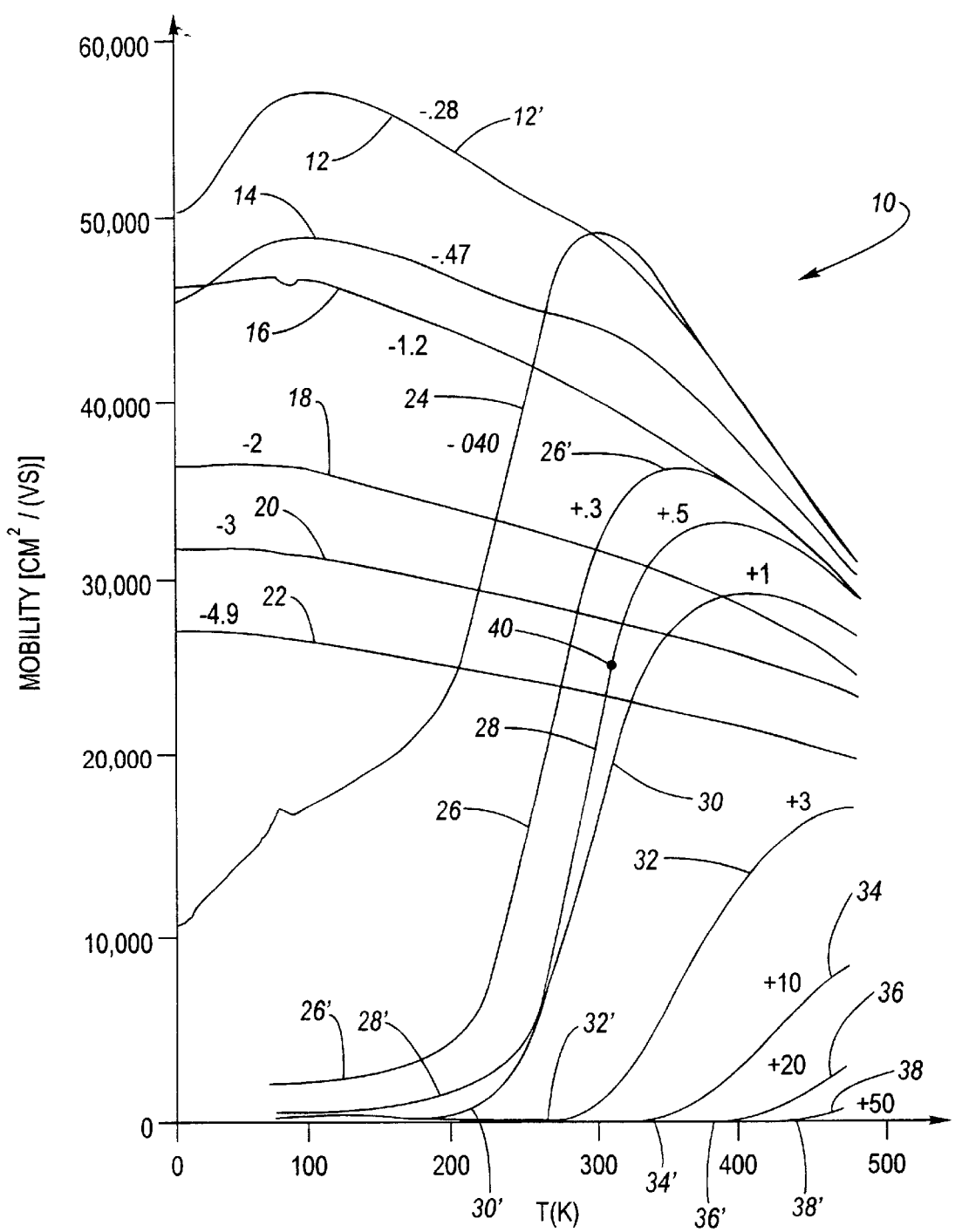
FIG. 1 shows the temperature dependence of the mobility of a number of n type and p type doped InSb films.

FIG. 1 (described later) shows the temperature dependence of the mobility of a number of n type and p type doped InSb films, which follow the process described above. The position of this maximum is a function of the doping level and the energy gap of the semiconductor. The effect of the doping level is apparent from the depicted curves of FIG. 1. The effect of the energy gap is due to the fact that a semiconductor with a small energy gap will have more thermally induced electrons at any given temperature than a semiconductor with a larger energy gap. Therefore, if the average mobility of nearly undoped InSb (Gap=0.18 eV at 300 K) peaks around 290 K, that of an InAs(1−x)Sb(x) alloy with x=0.4 (Gap=0.11 eV at 300 K) will peak below 200 K.

The present invention is a recipe in which we combine multiple layers of high mobility semiconductor materials whose mobilities peak at different temperatures in parallel with each other. The average mobility of a multilayer structure built from three films, for example, one of which with a mobility peaking at −20° C., one peaking at 100° C., and one peaking at 180° C., is relatively temperature independent from −40° C. to 200° C. A magnetoresistor built from such a multilayer stack is calculated to have a sensitivity with reduced temperature dependence from −40° C. to 200° C. We illustrate this principle quantitatively using InSb films doped at different levels. Also, we do not merely use the average mobility of the constituent layers, but in the analytical calculations of the sensitivity we use the complete galvanomagnetic tensor of the multilayer and the analytical formulas for the device sensitivity.

A similar approach can be used to create Hall sensors with a temperature independent sensitivity, since the sensitivity of a Hall sensor is also a function of mobility, albeit a different function than for a magnetoresistor. Therefore, the present invention encompasses magnetoresistors and Hall sensors made from a multilayer stack of semiconductor layers, each of which being ten nanometers or more thick, in which each layer has a temperature dependence of the mobility that has a maximum at a different temperature. The latter can be achieved either by changing the doping level between the different layers (different layers can be doped either n or p type to different levels), or by changing the alloy composition so that each semiconductor layer becomes intrinsic at a different temperature. Obvious extensions of this are: a continuous gradation of the doping level or composition over the thickness a film, and a film doped both n and p type in the same layer (i.e. counterdoped). The manufacturing and fabrication techniques to realize these devices are well known in the art.

The fundamental properties of the constituent films that need to be combined to make the magnetoresistors and Hall plates described in the present invention have been measured experimentally on actual films. The magnetic field and temperature dependence of the actual MR devices and Hall plates have been modeled analytically, using mathematical techniques that are very well developed in the art and have been used successfully in the past to design other magnetoresistive elements and Hall plates.

In order to obtain a less temperature sensitive MR or Hall sensor, one can use multiple layers of high mobility semiconductors such as indium antimonide (InSb) or alloys of InSb in which a certain mole fraction of indium is replaced with gallium or a certain mole fraction of Sb is replaced by arsenic or phosphorous, and in which each layer has a temperature dependence of the mobility that peaks as a function of temperature. The temperature at which these peaks occur depends on the doping level and the energy gap of the semiconductor, which in turn depends on the alloy composition. For the analysis presented here, we will confine ourselves to the influence of the doping level.

FIG. 1, experimentally obtained, shows the temperature dependence of the average mobility of a series of InSb films 10, 1.0 to 1.5 micrometers thick, doped either n type with tellurium (Te) 12–24 or p type with manganese (Mn) 26–38. Other n type dopants are: selenium, sulphur, or silicon. Other p type dopants are: beryllium, carbon, magnesium, calcium, strontium, or zinc. The exact chemical used as an n type or p type dopant does not alter the principle outlined here. The curves 10 are labeled by the density of extrinsic charge carriers (i.e. the charge carriers due to the doping level in units of $10^{17}$ cm$^{-3}$). The extrinsic carrier density is labeled positive for the p type doped material, and negative for the n type doped material. For example, the curve 12 labeled −0.28 12' represents a sample doped n type to $0.28 \times 10^{17}$ cm$^{-3}$.

The curves in FIG. 1 can be explained as follows. We start by observing that the mobility of the holes in InSb is much smaller than that of electrons. The energy gap of InSb is small (0.18 eV near room temperature). At room temperature, therefore, about $0.2 \times 10^{17}$ electrons are thermally excited across the energy gap. These thermally excited electrons are called intrinsic electrons, as opposed to the extrinsic electrons or holes induced by the doping. In n type doped material, both extrinsic and intrinsic electrons have the same high mobility, which decreases slowly as the temperature is increased, represented by curves 12–22, due to scattering of the electrons on phonons (or lattice vibrations). In p type material at low temperature, where only extrinsic holes are present, FIG. 1 shows the low mobility of these holes, represented by 26'–38'. As the temperature of p type doped samples is increased, extrinsic electrons start to appear. As these have much higher mobilities than the holes, they dominate the electrical conduction even when their density is lower than that of the extrinsic holes. For example, in the sample doped with $0.5 \times 10^{17}$ cm$^{-3}$ extrinsic holes, 28, the $0.2 \times 10^{17}$ cm$^{-3}$ intrinsic electrons at 300 K dominate and give an average mobility on the order of 24,000 cm$^2$/(V s) 40. As a result, there is a maximum in the temperature dependence of the lightly p type doped samples. The temperature of this maximum is roughly located near the temperature where the sample "goes intrinsic", i.e. where the density of the intrinsic electrons equals the density of the extrinsic holes.

The situation of the sample unintentionally doped n type to $0.04 \times 10^{17}$ cm$^{-3}$ 24 in FIG. 1 is somewhat different. Its mobility can be explained by the presence of a very thin layer at the semiconductor/substrate interface which contains a large density of dislocations. The dislocations release electrons in the film near that layer, and these electrons have a very low mobility due to their scattering on the dislocations. These dislocation induced electrons are extrinsic. As the temperature is increased, conduction though the film becomes dominated by the intrinsic electrons in the bulk of the film, and the reasoning recounted in the paragraph above holds.

There are two mechanisms by which we can influence the temperature at which the average mobility peaks: the doping level, as illustrated in FIG. 1, and the chemical composition of the film. By alloying InSb with As, the energy gap can be reduced. This will reduce the temperature at which the sample goes intrinsic. By alloying the sample with Ga, the energy gap increases, and so will the temperature at which it goes intrinsic.

It is clear from FIG. 1 that by combining in parallel two layers of material which have mobilities that peak at different temperatures, the average mobility of the multilayer structure can be designed to have a much more temperature independent mobility. This occurs because the average mobility $\mu(s)$ of two layers of thicknesses $t(1)$ and $t(2)$ with electron densities $n(1)$ and $n(2)$ and mobilities $\mu(1)$ and $\mu(2)$ connected in parallel is roughly given by the formula for resistors connected in parallel. That is, $1/n(s)\mu(s)t(s)=1/n(s)\mu(1)t(1)+1/n(2)\mu(2)t(2)$.

The magnetic field sensitivity of semiconductor magnetic field sensors, such as Hall sensors and magnetoresistors, is a function mainly of the mobility. To obtain sensors with a reduced temperature dependence of mobility, one can therefore make them from multiple layers with mobilities that peak at different temperatures, i.e. layers that go intrinsic at different temperatures.

Figure 2:
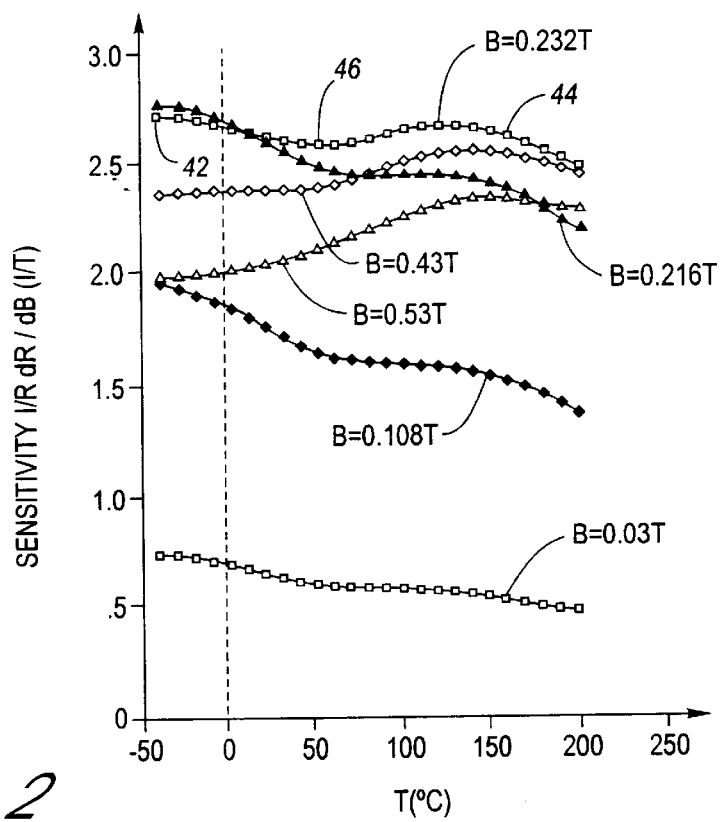
FIG. 2 depicts a first sensitivity example of a multilayer MR device according to the present invention.

As a first example of this recipe, we carried out the complete theoretical design of a magnetoresistor built in the Corbino geometry for a multilayer of InSb. A first theoretical example of a magnetoresistor, shown in FIG. 2, used two layers, one doped n type at $2 \times 10^{17}$ cm$^{-3}$ whose mobility peaks at 50 K, and one doped p type at $0.5 \times 10^{17}$ cm$^{-3}$ whose mobility peaks at 380 K. The calculations producing the plot of FIG. 2 were carried out using the complete galvanomagnetic tensor of the magnetoresistor at each value of the magnetic field, thus including not only the geometrical magnetoresistance, but also the intrinsic magnetoresistance that arises in bulk semiconductors because of the simultaneous presence of two carriers (electrons and holes) with two very different mobilities. This intrinsic magnetoresistance gives a boost to the high temperature sensitivity of the devices, as claimed by H. H. Wieder in U.S. Pat. No. 3,617,975. FIG. 2 shows the sensitivity S(T,B) as a function of temperature at various values of the biasing magnetic field B of a magnetoresistor made from a bilayer containing 18% of the n type film and 82% of the p type film and is defined as:

$$S(B, T)=1/R(B, T)\times(dR(B, T)/dB),$$

wherein S varies with magnetic field B and temperature T, R is the resistance of the MR which also varies with magnetic field B and temperature T, and dR(B, T)/dB is the rate of change of resistance R with respect to magnetic field B.

Since the sensitivity is a function of the biasing magnetic field B, the bilayer film was optimized to operate at a biasing field of 0.323 T, and in a temperature range from −40° C. to 180° C. Different operating conditions can be met with different layer compositions. Concentrating on the temperature dependence of the curve at 0.323 T, the maximum at low temperature 42 in FIG. 2 is due to the contribution of the n type layer, the maximum near 130° C. 44 due to the p type layer.

Figure 3:
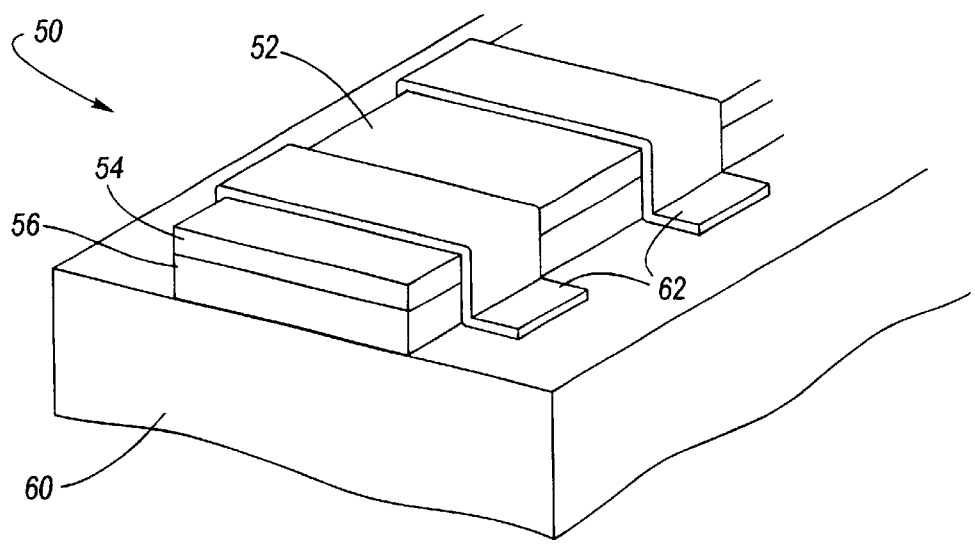
FIG. 3 is a schematic representation of a die of the multilayer MR device of FIG. 2 according to the present invention.

FIG. 3 is a schematic representation of a die 50 of the two layer MR device 52 of FIG. 2. In FIG. 3 the first layer 54, representing 18% of the total thickness of the MR 52, is 0.18 micrometers thick and consists of InSb doped n type with Tellurium (Te) to $2 \times 10^{17}$ cm$^{-3}$. The second layer 56, representing 82% of the total thickness of the MR 52, is 0.82 micrometers thick and consists of InSb doped p type with Beryllium (Be) to $5 \times 10^{16}$ cm$^{-3}$. The substrate 60 is, typically, GaAs and the shorting bars 62 are, typically, a titanium-platinum-gold multilayer. The thicknesses of the layers 54 and 56 may be changed but must maintain the same proportion. The techniques to fabricate such a die 50 are well known in the art.

Figure 4:
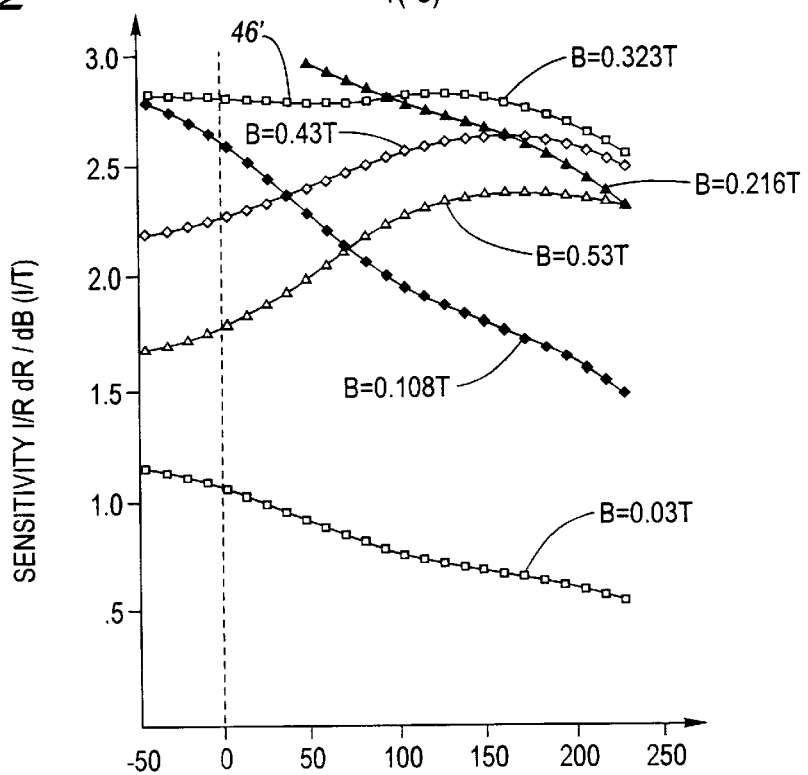
FIG. 4 depicts a second sensitivity example of a multilayer MR device according to the present invention.

To illustrate the power of the technique according to the present invention, we can show how to fill in the trough 46 between the two maxima 42 and 44 in FIG. 2 by adding a third layer. The theoretical design of FIG. 4 shows the sensitivity as a function of temperature at various values of the biasing magnetic field B of a magnetoresistor built from three layers: 16% of the total thickness is doped n type to $1.2 \times 10^{17}$ cm$^{-3}$, 20% is doped p type to $0.3 \times 10^{17}$ cm$^{-3}$ and 64% is doped p type to $0.5 \times 10^{17}$ cm$^{-3}$. The trough 46 near 50° C. in FIG. 2 at B=0.32 T has now nearly vanished in FIG. 3 46' at B=0.323 T. No penalty in the absolute value of the sensitivity was incurred to achieve this result.

Figure 5:
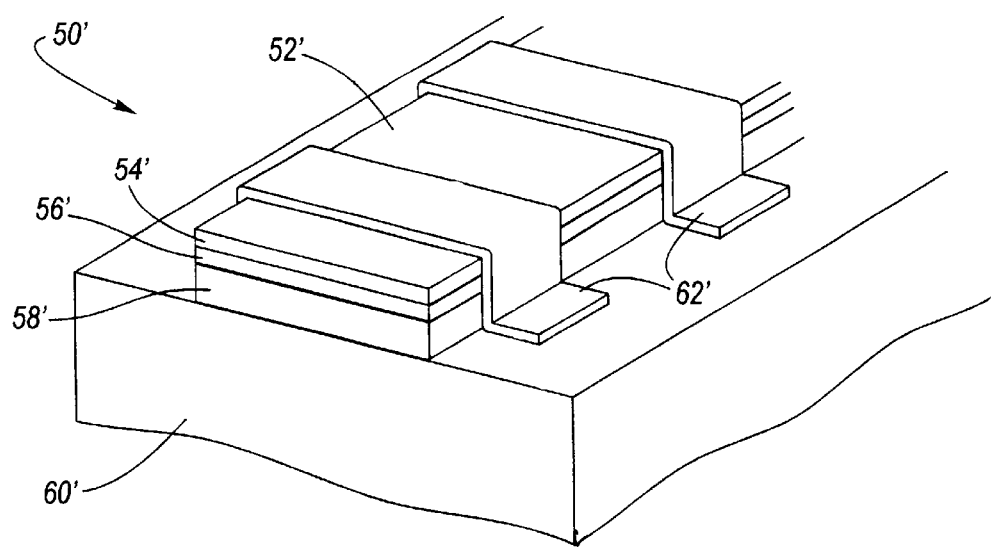
FIG. 5 is a schematic representation of a die of the multilayer MR device of FIG. 4 according to the present invention.

FIG. 5 is a schematic representation of a die 50' of the three layer MR device 52' of FIG. 4. In FIG. 5 the first layer 54', representing 16% of the total thickness of the MR 52', is 0.16 micrometers thick and consists of InSb doped n type with Tellurium (Te) to $1.2 \times 10^{17}$ cm$^{-3}$. The second layer 56', representing 20% of the total thickness of the MR 52', is 0.20 micrometers thick and consists of InSb doped p type with Beryllium (Be) to $0.3 \times 10^{17}$ cm$^{-3}$. The third layer 58', representing 64% of the total thickness of the MR 52, is 0.64 micrometers thick and consists of InSb doped p type with Beryllium (Be) to $0.5 \times 10^{17}$ cm$^{-3}$. The substrate 60' is, typically, GaAs and the shorting bars 62' are, typically, a titanium-platinum-gold multilayer. The shorting bars 62' short the Hall voltage to create the magnetoresistance effect. The thicknesses of the layers 54', 56', and 58' may be changed but must maintain the same proportion. The techniques to fabricate such a die 50' are well known in the art.

When a Hall effect plate is supplied a constant voltage $V_{IN}$, its output $V_H$ is proportional to only the magnetic field B and the mobility $\mu$ of the semiconductor according to the relation $$V_H = gV_{IN}\mu B, \qquad (1)$$

where g is a proportionality factor which depends on the geometry of the plate. In order to obtain a Hall sensor that has a low temperature coefficient of drift, it is sufficient to design the Hall plate out of a material with a reduced temperature dependence of mobility. As intrinsic electrons are induced by temperature into the semiconductor, the Hall plate will draw more current, but the output amplitude will not vary much with temperature. The following recipe for the Hall plate is the second example of a design of a galvanomagnetic device with a reduced temperature dependence. The optimum layer thicknesses and doping levels are different for both devices, since the sensitivities of both devices (MR and Hall) depend in different ways on the mobility.

We carried out the complete theoretical designs of Hall plates with temperature compensated sensitivity aimed at the temperature range −50° C. to 125° C. and at the temperature range −50° C. to 180° C. The calculations use the complete galvanomagnetic tensor at each value of the magnetic field, thus including the intrinsic magnetoresistance that arises in bulk semiconductors because of the simultaneous presence of two carriers (electrons and holes) with two very different mobilities. The intrinsic magnetoresistance decreases the current passing through the Hall plate at higher fields, and therefore lets the output voltage deviate from the simple law (1), which is only valid at very low values of magnetic field, and is replaced by:

$$V_H = g V_{IN} \sigma_{xy}(B) / \sigma_{xx}(B), \quad (2)$$

where $\sigma_{xx}(B)$ is the longitudinal conductivity of the material in the presence of a magnetic field B, and $\sigma_{xy}(B)$ is the transverse, or Hall, conductivity. Since, to first order, $\sigma_{xy}(B)$ is inversely proportional to the magnetic field B and $\sigma_{xx}(B)$ is only weakly dependent on the magnetic field B, the sensitivity of the Hall plate is given by:

$$\Delta V_H / \Delta B = -g V_{IN} \sigma_{xy}(B) / (B \sigma_{xx}(B)). \quad (3)$$

For calculating the Hall plate designs that follow, we use the experimental data for $\sigma_{xx}(B)$ and $\sigma_{xy}(B)$ obtained at each temperature on each sample whose mobility is given in FIG. 1. As can be seen from Eq. (2), the design will be optimized for a certain range of biasing magnetic fields. We will optimize the designs for operation near between +0.1 and −0.1 Tesla (T).

Figure 6:
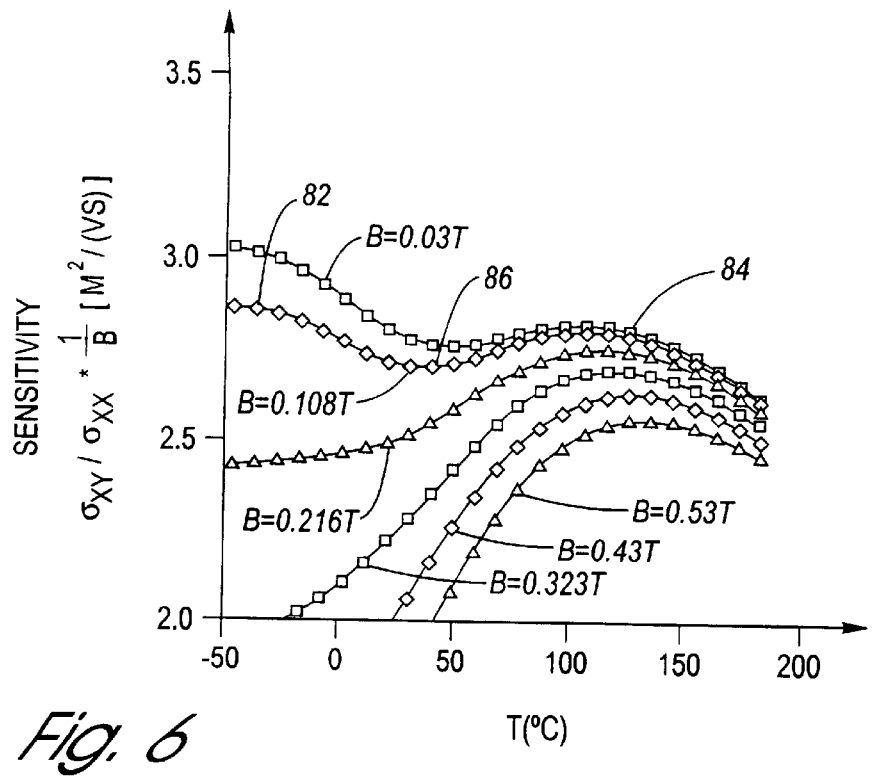
FIG. 6 depicts a first sensitivity example of a multilayer Hall device according to the present invention.

For a first theoretical example of a Hall plate for the −50° C. to 125° C. temperature range, we used two semiconductor layers, one doped n type at $2 \times 10^{17}$ cm$^{-3}$, whose mobility peaks at 50 K, and one doped p type at $5 \times 10^{16}$ cm$^{-3}$, whose mobility peaks at 380 K. A bilayer containing 7% of the n type film and 93% of the p type film has an output sensitivity proportional to $\sigma_{xy}(B)/(B\sigma_{xx}(B))$ and is shown in FIG. 6. Concentrating on the temperature dependence of the curve at 0.108 T, the maximum 82 at low temperature is due to the contribution of the n type layer, the maximum 84 near 120° C. due to the p type layer. We can fill in the trough 86 between the two maxima 82 and 84 by adding a third layer.

Figure 7:
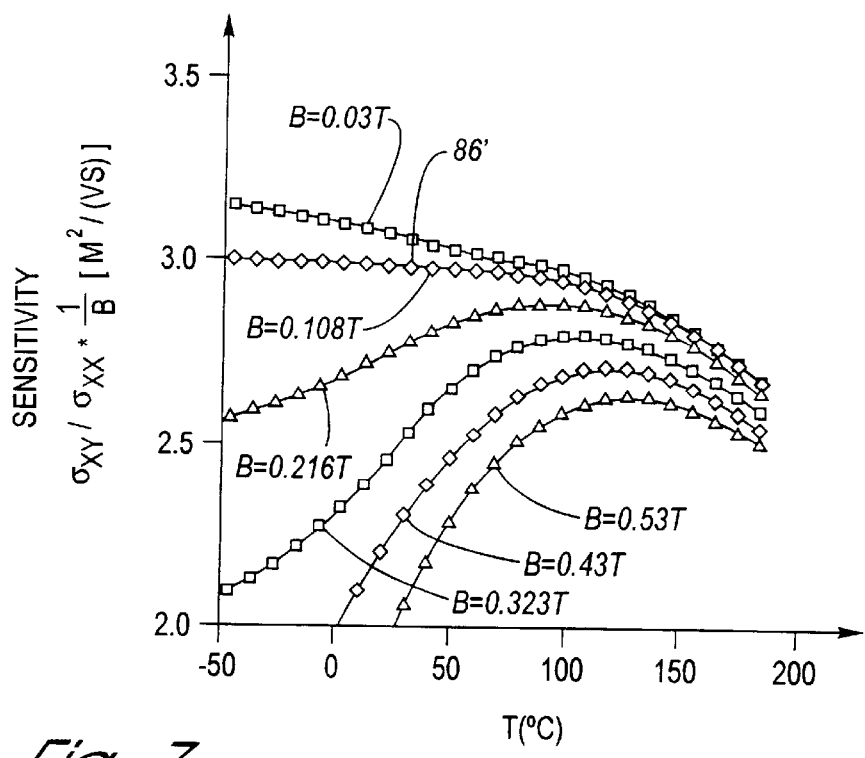
FIG. 7 depicts a second sensitivity example of a multilayer Hall device according to the present invention.

FIG. 7 shows the sensitivity of a Hall plate built from three layers: a first layer is 7% of the total thickness and is doped n type to $1.2 \times 10^{17}$ cm$^{-3}$, a second layer is 20% of the total thickness and is doped p type to $3 \times 10^{16}$ cm$^{-3}$ and a third layer is 73% of the total thickness and is doped p type to $5 \times 10^{16}$ cm$^{-3}$. The trough 86 near 50° C. in FIG. 6 has now nearly vanished as can be seen at point 86' in FIG. 8. No penalty in the absolute value of the sensitivity was incurred to achieve this result.

The Hall plate shown in FIG. 7 has a very good sensitivity, equal to that of a Hall sensor made from a semiconductor with an average mobility of 30,000 cm$^2$/(Vs) over the design temperature range. A higher maximum operating temperature can be achieved, at the expense of sensitivity.

Figure 8:
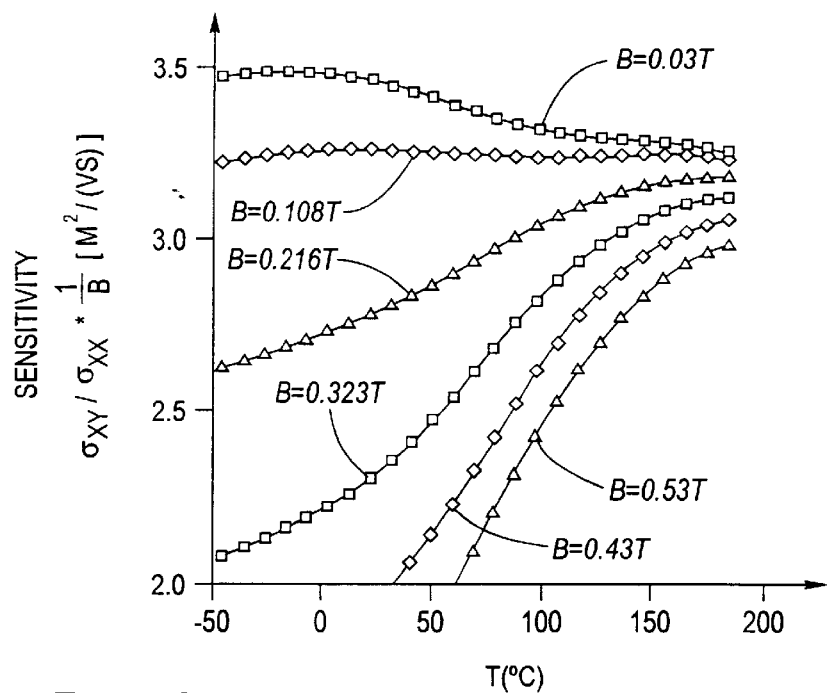
FIG. 8 depicts a third sensitivity example of a multilayer Hall device according to the present invention.

The theoretical design of a Hall plate for the −50° C. to 180° C. temperature range optimized to operate at magnetic fields around between +0.1 and −0.1 T is shown in FIG. 8. In the design shown FIG. 8, we make use of a much heavier doped p layer, namely curve 26 (p=$3.0 \times 10^{17}$ cm$^{-3}$) of FIG. 1 which has its maximum mobility 26' above 200° C. The value of the high temperature mobility for that film does not exceed 20,000 cm$^2$/(Vs) in the temperature range studied. The value of the bilayer film constructed using that p type layer cannot exceed the maximum value of its lowest mobility component. This process is illustrated in the performance of the bilayer consisting of 5% of an n type layer doped at $1.2 \times 10^{17}$ cm$^{-3}$ and 95% of a p type layer doped at $3 \times 10^{17}$ cm$^{-3}$ shown in FIG. 8. Such a bilayer makes an InSb Hall sensor with a reduced temperature dependence of sensitivity at biasing fields of between +0.1 and −0.1 T and with a sensitivity equivalent to that of a film with a mobility just below 20,000 cm$^2$/(Vs). For comparison, bulk InAs may have a mobility that approaches 30,000 cm$^2$/(Vs) and thin film InAs material can exceed 20,000 cm$^2$/(Vs) at room temperature. However, the mobility of bulk intrinsic InAs at 180° C. is about 14,000 cm$^2$/(Vs). InAs Hall plates, unless heavily doped, will therefore have a much larger temperature coefficient than the Hall plate shown in FIG. 8 and, if they are heavily doped, they will have a lower sensitivity.

Figure 9:
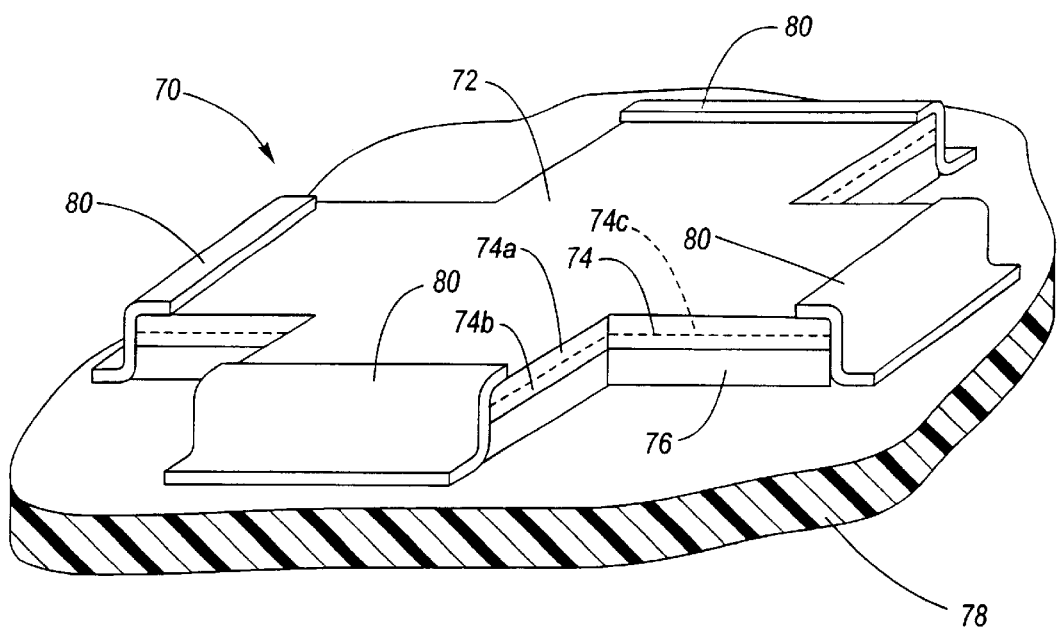
FIG. 9 is a schematic representation of a die of the multilayer Hall device of FIG. 8 according to the present invention.

FIG. 9 is a schematic representation of a die 70 of the two layer Hall Plate 72 of FIG. 6. In FIG. 9 the first layer 74, representing 5% of the total thickness of the Hall plate 72, is 0.05 micrometers thick and consists of InSb doped n type with Tellurium (Te) to $1.2 \times 10^{17}$ cm$^{-3}$. The second layer 76, representing 95% of the total thickness of the Hall plate 72, is 0.95 micrometers thick and consists of InSb doped p type with Beryllium (Be) to $3 \times 10^{17}$ cm$^{-3}$. The substrate 78 is, typically, GaAs and the contacts 80 are, typically a titanium-platinum-gold multilayer. The contacts 80 provide for external electrical connections to the Hall plate. The thicknesses of the layers 74 and 76 may be changed but must maintain the same proportion. The techniques to fabricate such a die 70 are well known in the art. A three layer Hall plate, as discussed above relative to FIG. 7, is depicted also at FIG. 9 via a layer delimiting dashed line 74c (shown only for visualization of the three layer Hall plate), wherein the layers are: a first layer 74a, a second layer 74b and a third layer 76.

The above calculations are based on the ratio of the thicknesses of the electrically active layers of the films. In practice, the physical layers have a tolerance on thickness determined by the metallurgical thickness and by the thickness of the depletion layers, regions at the film's boundaries in which the electrostatic forces decrease the actual charge carrier densities. At the doping levels previously mentioned, the depletion region thicknesses are on the order of 0.03 microns and may be temperature dependent.

There is a continuum of solutions to the design of temperature compensated multilayer Hall plates: we can vary the n type and p type doping levels, typically by a factor of 3 in either direction, and obtain results similar to those previously shown. Increasing the doping levels results generally in decreasing the sensitivity, in increasing the current consumption, and in decreasing the depletion layer thicknesses, thus improving the manufacturability.

Increasing the thicknesses of the layers increases the current consumption and improves the manufacturability by decreasing the relative influence of the depletion layers. The total thickness of a multilayer device is best in the 0.5 to 2 micron range.

The in plane geometry of the Hall plate is extensively discussed in the literature. In general, short current paths (short and wide, squarish plates) result in a higher current consumption and better sensitivity. The useful range of aspect ratios for the Hall plate varies from a length to width ratio of 10:1 to 1:1, wherein the length is defined as the distance between two diametrically opposed contacts 80, and wherein the width is defined as the length of a contact 80.

To those skilled in the art to which this invention appertains, the above described preferred embodiment may be subject to change or modification. Such change or modification can be carried out without departing from the scope of the invention, which is intended to be limited only by the scope of the appended claims.

What is claimed is:

1. A composite magnetic sensor comprising:

a galvanomagnetic device formed of a plurality of layers;

wherein each layer is a respectively selected semiconductor material having a respective mobility peak at a respective temperature, wherein the respective temperatures of the mobility peaks are selected so as to be mutually spaced apart over a predetermined range of temperature;

wherein said layers cumulatively provide magnetic sensitivity which is substantially insensitive to changes in temperature over said predetermined range of temperature; and wherein each layer has a thickness of at least ten nanometers;

wherein said galvanomagnetic device comprises a single magnetoresistive die comprising a first layer and at least one additional layer;

wherein each layer is comprised of at least one of indium antimonide and an alloy of indium antimonide, said alloy being selected from the group consisting of a selected mole fraction of indium replaced by gallium represented by $In_{1-x}Ga_xSb$ where $0<x<1$, and of a selected mole fraction of antimony replaced by at least one of phosphorous represented by $InSb_{1-y}P_y$ where $0<y<1$, and arsenic represented by $InSb_{1-z}As_z$ where $0<z<1$, each layer having a respectively predetermined doping level and respectively predetermined energy gap which thereby provide the respective mobility thereof;

wherein said layers comprise a first layer, a second layer and a third layer, said first second and third layers having a total thickness, wherein the first layer comprises substantially 16% of the total thickness and is doped n type to substantially $1.2 \times 10^{17}$ cm$^{-3}$, the second layer comprises substantially 20% of the total thickness and is doped p type to substantially $0.3 \times 10^{17}$ cm$^{-3}$, and the third layer comprises substantially 64% of the total thickness and is doped p type to substantially $0.5 \times 10^{17}$ cm$^{-3}$.

2. The composite magnetic sensor of claim 1, further comprising:

a substrate of GaAs upon which is formed said plurality of layers; and a plurality of metallic shorting bars in contact with at least one layer of said magnetoresistive die.

3. A composite magnetic sensor comprising:

a galvanomagnetic device formed of a plurality of layers;

wherein each layer is a respectively selected semiconductor material having a respective mobility peak at a respective temperature, wherein the respective temperatures of the mobility peaks are selected so as to be mutually spaced apart over a predetermined range of temperature;

wherein said layers cumulatively provide magnetic sensitivity which is substantially insensitive to changes in temperature over said predetermined range of temperature; and wherein each layer has a thickness of at least ten nanometers;

wherein said galvanomagnetic device comprises a single magnetoresistive die comprising a first layer and at least one additional layer;

wherein each layer is comprised of at least one indium antimonide and an alloy of indium antimonide, said alloy being selected from the group consisting of a selected mole fraction of indium replaced by gallium represented by $In_{1-x}Ga_xSb$ where $0<x<1$, and of a selected mole fraction of antimony replaced by at least one of phosphorous represented by $InSb_{1-y}P_y$ where $0<y<1$, and arsenic represented by $InSb_{1-x}$ where $0<z<1$, each layer having a respectively predetermined doping level and respectively predetermined energy gap which thereby provide the respective mobility peak thereof;

wherein said layers comprise a first layer, a second layer and a third layer, said first, second and third layers having a total thickness, wherein the first comprises substantially 16% of the total thickness and is doped n type with at least one element selected from the group consisting of Te, Se, S and Si to substantially $1.2 \times 10^{17}$ cm$^{-3}$, wherein the second layer comprises substantially 20% of the total thickness and is doped p type with at least one element selected from the group consisting of Be, C, Mn, Mg, Sr, Cd and Zn to substantially $0.3 \times 10^{17}$ cm$^{-3}$, and the third layer comprises substantially 64% of the total thickness and is doped p type with at least one element one element selected from the group consisting of Be, C, Mn, Ca, Sr, Cd and Zn to substantially $0.5 \times 10^{17}$ cm$^{-3}$.

4. The composite magnetic sensor of claim 3, further comprising:

a substrate of GaAs upon which is formed said three layers; and a plurality of metallic shorting bars in contact with at least one layer of said magnetoresistive die.

5. A composite magnetic sensor comprising:

a galvanomagnetic device formed of a plurality of layers;

wherein each layer is a respectively selected semiconductor material having a respective mobility peak at a respective temperature, wherein the respective temperatures of the mobility peaks are selected so as to be mutually spaced apart over a predetermined range of temperature;

wherein said layers cumulatively provide magnetic sensitivity which is substantially insensitive to changes in temperature over said predetermined range of temperature; and wherein each layer has a thickness of at least ten nanometers;

wherein said galvanomagnetic device is a Hall plate comprising a plurality of layers having a total thickness, and total thickness being substantially between 0.5 microns and 2 microns, and having an aspect ratio of substantially between 10:1 and 1:1;

wherein each layer is comprised of at least one of indium antimonide and an alloy of indium antimonide, said alloy being selected from the group consisting of a selected mole fraction of indium replaced by gallium represented by $In_{1-x}Ga_xSb$ where $0<x<1$, and of a selected mole fraction of antimony replaced by at least one of phosphorous represented by $InSb_{1-y}P_y$ where $0<y<1$, and arsenic represented by $InSb_{1-z}As_z$ where $0<z<1$, having a respectively predetermined doping level and respectively predetermined energy gap which thereby provide the respective mobility peak thereof;

wherein said plurality of layers comprises a first layer, a second layer and a third layer, said first, second and third layers having a total thickness, wherein the first layer comprises substantially 7% of the total thickness and is doped n type to substantially $1.2 \times 10^{17}$ cm$^{-3}$, the second layer comprises substantially 20% of the total thickness and is doped p type to substantially $3 \times 10^{16}$ cm$^{-3}$, and the third layer comprises substantially 73% of the total thickness and is doped p type to substantially $5 \times 10^6$ cm$^{-3}$.

6. The composite magnetic sensor of claim 5, wherein said n type doping of said first layer is with at least one element selected from the group consisting of Te, Se, S and Si, and wherein said p type doping of said second and third layers is respectively with at least one element selected from the group consisting of Be, C, Mn, Mg, Ca, Sr, Cd and Zn.

7. The composite magnetic sensor of claim 6, further comprising:

a substrate of GaAs upon which is formed said first, second and third layers; and a plurality of metallic contacts in contact with at least one layer of said Hall plate.

8. A composite magnetic sensor comprising three layers, wherein each layer is comprised of at least one of indium antimonide and an alloy of indium antimonide, said alloy being selected from the group consisting of a selected mole fraction of indium replaced by gallium represented by $In_{1-x}Ga_xSb$ wherein $0<x<1$, and of a selected mole fraction of antimony replaced by at least one of phosphorous represented by $InSb_{1-y}P_y$ where $0<y<1$, and arsenic represented by $InSb_{1-z}As_z$ where $0<z<1$, each layer having a respectively predetermined doping level and respectively predetermined energy gap which thereby provide the respective mobility peak thereof;

wherein said layers comprise a first layer, a second layer and a third layer, said first second and third layers having a total thickness, wherein the first layer comprises substantially 16% of the total thickness and is doped n type to substantially $1.2 \times 10^{17}$ cm$^{-3}$, the second layer comprises 20% of the total thickness and is doped p type to substantially $0.3 \times 10^{17}$ cm$^{-3}$, and the third layer comprises substantially 64% of the total thickness and is doped p type to substantially $0.5 \times 10^{17}$ cm$^{-3}$.

9. The composite magnetic sensor of claim 8, wherein the first layer is doped n type with at least one group consisting of Te, Se, S and Si to substantially $1.2 \times 10^{17}$ cm$^{-3}$, wherein the second layer is doped p type with at least one element selected from the group consisting of Be, C, Mn, Ca, Sr, Cd and Zn to substantially $0.3 \times 10^{17}$ cm$^{-3}$, and wherein the third is layer is doped p with one element selected from the group consisting of Be, C, Mn, Ca, and Zn to substantially $0.5 \times 10^{17}$ cm$^{-3}$.

10. A Hall plate comprising:

a plurality of layers having a total thickness, said total thickness being substantially between 0.5 microns and 2 microns, and having an aspect ratio of substantially between 10:1 and 1:1; wherein each layer is comprised of at least one of indium antimonide and an alloy of indium antimonide, said alloy being selected from the group consisting of a selected mole fraction of indium replaced by gallium represented by $In_{1-x}Ga_xSb$ where $0<x<1$, and of a selected mole fraction of antimony replaced by at least one of phosphorous represented by $InSb_{1-y}P_y$ where $0<y<1$, and arsenic represented by $InSb_{1-z}As_z$ where $0<z<1$, having a respectively predetermined doping level and respectively predetermined energy gap which thereby provide the respective mobility peak thereof; and wherein said plurality of layers comprises a first layer, a second layer and a third layer, said first, second and third layers having a total thickness, wherein the first layer comprises substantially 7% of the total thickness and is doped n type to substantially $1.2 \times 10^{17}$ cm$^{-3}$, the second layer comprises substantially 20% of the total thickness and is doped p type to substantially $3 \times 10^{16}$ cm$^{-3}$, and the third layer comprises substantially 73% of the total thickness and is doped p type to substantially $5 \times 10^{16}$ cm$^{-3}$.

11. The Hall Plate of claim 10, wherein said n type doping of said first layer is with at least one element selected from the group consisting of Te, Se, S and Si, and wherein said p type doping of said second and third layers is respectively with at least one element selected from the group consisting of Be, C, Mn, Mg, Ca, Sr, Cd and Zn.

* * * * *